US008519739B1

(12) United States Patent
Leon (10) Patent No.: US 8,519,739 B1
(45) Date of Patent: Aug. 27, 2013

(54) HIGH-SPEED PROCESSOR CORE COMPRISING DIRECT PROCESSOR-TO-MEMORY CONNECTIVITY

(75) Inventor: John Leon, Anaheim, CA (US)

(73) Assignee: ISC8 Inc., Costa Mesa, CA (US)

( * ) Notice: Subject to any disclaimer, the term of this patent is extended or adjusted under 35 U.S.C. 154(b) by 25 days.

(21) Appl. No.: 13/098,655

(22) Filed: May 2, 2011

Related U.S. Application Data

(60) Provisional application No. 61/343,710, filed on May 3, 2010.

(51) Int. Cl.
*H03K 19/173* (2006.01)
(52) U.S. Cl.
USPC ............................................................ 326/38
(58) Field of Classification Search
USPC .............................................. 326/37–47, 101
See application file for complete search history.

(56) References Cited

U.S. PATENT DOCUMENTS

| | | | |
|---|---|---|---|
| 6,614,259 B2 * | 9/2003 | Couts-Martin et al. | 326/40 |
| 6,856,167 B2 * | 2/2005 | Ozguz et al. | 326/41 |
| 7,086,025 B1 * | 8/2006 | Yang | 326/38 |
| 7,265,579 B2 * | 9/2007 | Carlson et al. | 326/41 |
| 7,609,087 B1 * | 10/2009 | Theron | 326/38 |
| 7,649,386 B2 * | 1/2010 | Ozguz et al. | 326/101 |
| 7,902,879 B2 | 3/2011 | Ozguz et al. | |
| 8,090,984 B2 * | 1/2012 | Moyer et al. | 714/12 |
| 2003/0223295 A1 * | 12/2003 | Ozguz et al. | 365/201 |
| 2005/0122758 A1 * | 6/2005 | Carlson et al. | 365/63 |
| 2008/0074144 A1 * | 3/2008 | Ozguz et al. | 326/47 |
| 2008/0151894 A1 * | 6/2008 | Maiyuran et al. | 370/392 |
| 2009/0328038 A1 * | 12/2009 | Yamada et al. | 718/1 |
| 2010/0148822 A1 * | 6/2010 | Ozguz et al. | 326/101 |

* cited by examiner

*Primary Examiner* — Thienvu Tran
(74) *Attorney, Agent, or Firm* — W. Eric Boyd, Esq.

(57) ABSTRACT

A high-speed processor core having a plurality of individual FPGA-based processing elements configured in a synchronous or asynchronous pipeline architecture with direct processor-to-memory interconnectivity that avoids the latency and bus contention delays of FPGAs using conventional bused memory.

The high-speed processor core has one or more memory structures such as SDRAM or QDR electronic memory and is electrically coupled directly to one or more FPGAs using an access lead network to provide a pipelined set of FPGA-based processor elements for processing one or more predetermined operations such as one or more detection algorithms at line rates.

14 Claims, 4 Drawing Sheets

HIGH-SPEED PROCESSOR CORE COMPRISING DIRECT PROCESSOR-TO-MEMORY CONNECTIVITY

CROSS-REFERENCE TO RELATED APPLICATIONS

This application claims the benefit of U.S. Provisional Patent Application No. 61/343,710, filed on May 3, 2010 entitled "High Speed Processing Core Comprising Direct Memory-to-Processor Interconnectivity" pursuant to 35 USC 119, which application is incorporated fully herein by reference.

STATEMENT REGARDING FEDERALLY SPONSORED RESEARCH AND DEVELOPMENT

N/A

BACKGROUND OF THE INVENTION

1. Field of the Invention

The invention generally relates to the field of high-speed, low latency electronic processors utilizing reconfigurable logic devices such as field programmable gate arrays or "FPGAs".

More specifically, the invention relates to a high-speed electronic processor core comprising direct processor-to-memory interconnectivity that avoids the latency and bus contention delays of prior art processors incorporating bused memory in connection with an FPGA.

2. Description of the Prior Art

The ability to perform massively parallel data processing operations at high data/line rates in applications such as intrusion detection, detection of malicious code or viruses, analysis of DOS attacks or statistical inspection of IPV4 and IPV6 internet packets requires very dense, efficient, low-latency, processor-to-memory interconnectivity that is lacking in prior art electronic processor devices.

Prior art "bused" processor-to-memory structures and architectures in existing processors lack sufficient density of memory and necessary speed of processor-to-memory interconnectivity that is required for the execution of internet attack detection algorithms, internet traffic deep packet inspection algorithms, packet feature extraction and similar algorithm execution at very high line rates (e.g., 100 Gb/s). Further, prior art "bused memory" architectures lack the ability to scale or to meet overall data processing speeds needed to achieve acceptable results at line rates.

All manner of processing devices such as digital signal processors, microprocessors, microcontrollers, digital network processors, CPLDs or field programmable gate arrays ("processors" herein) are used in applications where low latency, fast access to electronic memory is needed. Field programmable gate array devices or "FPGAs" in particular are well-suited for use in, for instance, the above cyber-security processing applications, due in part to their firmware modifiable nature, i.e., an FPGA can be reconfigured or the code or algorithm it is executing can be modified or replaced in real time at low cost, which benefits are not available in, for instance, in processors using application specific integrated circuits ("ASICs").

Notwithstanding the great utility of FPGAs, there exist several limitations to the usefulness of these devices in their commercial off the shelf ("COTS") form. One constraint with respect to prior art FPGA-based architectures is due to the limited amount of memory available within commercially available FPGAs.

Figures 1, 2:
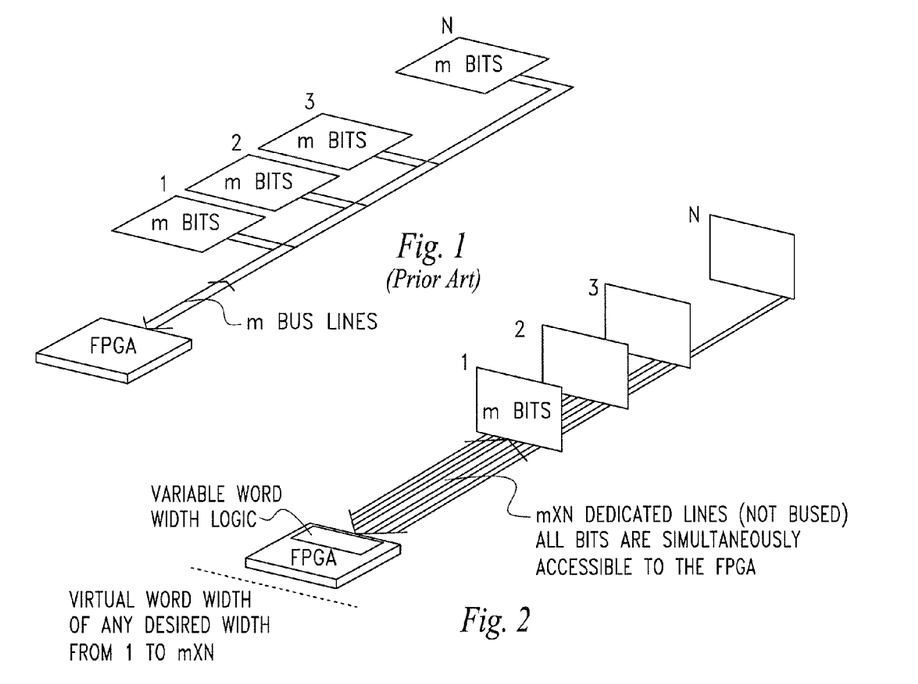
FIG. 1 is a simplified schematic view of a prior art, bused interface between an FPGA and a planar-arranged memory array where the word width is fixed and limited to a physical bus width of only m-bits.
FIG. 2 is a simplified schematic view of a memory-enhanced field programmable gate array as disclosed in U.S. Pat. No. 6,856,167 entitled "Field Programmable Gate Array with a Variably Wide Word Width Memory" issued Feb. 15, 2005 where all memory bits are simultaneously available to the FPGA such that the FPGA, incorporating suitable logic, can implement a virtual word width of any desired width from 1 to mXN bits.

A further limitation of prior art FPGA-based processors is illustrated in FIG. 1 in that FPGAs are typically fabricated based on a design rule that assumes a fixed and limited word width, which design is particularly limiting when the FPGA is used in combination with a large amount of off-device memory such as is required in high performance applications such as data processing or networking.

Yet further, when an FPGA is used to read from and write into a memory array that is arranged in a typical planar (i.e., printed circuit board) fashion, a considerable amount of space on the printed circuit board is required in order to physically provide for the combination of the FPGA and the memory. Even when space is available for a large planar area to support the FPGA and surrounding memory, relatively long interconnects and buses between the devices inherently increases parasitic impedance problems and timing delays at high processing speeds with associated degradation in system performance.

What is needed is a processor architecture that takes advantage of the flexibility of FPGA devices, that has a variably wide word width necessary for the diverse algorithms associated with deep packet inspection or cyber-security applications and which has high-speed access to large amounts of electronic memory but that does not have the delay and timing issues associated with memory bus contention and arbitration.

The invention overcomes the deficiencies in the prior art and comprises one or more memory structures such as SRAM, DRAM, SDRAM, or Quad Data Rate SRAM ("QDR") electronic memory and electrically couples the memories directly to a plurality of FPGAs using an access lead network to provide the FPGA-based processing elements with bus-less access to the one or more memory structures. This configuration provides a high-speed processor core capable of performing massively parallel data processing operations with dramatically reduced memory access delays associated with prior art bus contention or arbitration.

BRIEF SUMMARY OF THE INVENTION

Applicant discloses a high-speed, scalable processor core device and architecture that, in one embodiment, takes advantage of three-dimensional, stacked memory elements or structures such as SDRAM or QDR electronic memory integrated circuit chips.

In a first aspect of the invention, a high-speed processor core is disclosed comprising a first reconfigurable processing element such as a first processor which, in one embodiment comprises an FPGA, that is configured to perform a first predetermined operation such as a first algorithm, and comprising a second reconfigurable processing element such as a second FPGA that is configured to perform a second predetermined operation such as a second algorithm. It is expressly noted that the device and method of the invention is not limited to the use of an FPGA but the reconfigurable processing elements of the invention may comprise any processor including, by way of example and not by limitation, a digital signal processor, digital network processor, CPLD, microprocessor or microcontroller.

The first processing element and the second processing element are configured so that the output data set of the first predetermined operation or algorithm of the first processing element is received as the input data set of the second processing element.

The first and second processing elements preferably comprise a field programmable gate array, an access lead network electrically coupled and proximate to the field programmable gate array and a plurality of external memories electrically coupled and proximate to the access lead network wherein the field programmable gate array can independently access each of the plurality of external memories via the access lead network without the use of an address/data bus.

In a second aspect of the invention, one or more of the processing elements such as field programmable gate arrays are arranged and configured to operate with a variable word width.

In a third aspect of the invention, one or more of the processing elements such as field programmable gate arrays are arranged and configured to operate with a word width between 1 to mXN bits where m is the number of bits in the word width of each memory and N is the number of memories.

In a fourth aspect of the invention, the first processing element and the second processing element or field programmable gate arrays are configured in asynchronous pipeline architecture.

In a fifth aspect of the invention, at least one of the memories is a DDR SDRAM memory.

In a sixth aspect of the invention, at least one of the memories is a QDR SDRAM memory.

In a seventh aspect of the invention, a method for processing a data set is disclosed comprising a first step of providing a first reconfigurable processing element configured to perform a first predetermined operation such as a first algorithm, and providing a second reconfigurable processing element configured to perform a second predetermined operation such as a second algorithm. The first and second predetermined operations may be algorithms for the detection of intrusion detection, malicious code, scanning attempts, network traffic characterization or statistical information gathering or other network security algorithm on a network packet.

The first processing element and the second processing element are preferably configured in a balanced synchronous or asynchronous pipeline architecture whereby the output data set the first predetermined operation or algorithm of the first processing element is received as the input data set of the second processing element.

The first and second processing elements each preferably comprise a field programmable gate array, an access lead network electrically coupled and proximate to the field programmable gate array and a plurality of external memories electrically coupled and proximate to the access lead network wherein the field programmable gate array can independently access each of the plurality of external memories via the access lead network without use of an address/data bus.

The first predetermined operation or first algorithm is performed on a primary (i.e., unprocessed) data set which may comprise an internet packet received from a network using the first processing element to generate an output data set. The output data set is received as an input to the second processing element. A second predetermined operation such as a second algorithm is performed on the output data set using the second processing element.

In an eighth aspect of the invention, the field programmable gate arrays are arranged and configured to operate with a variable word width.

In a ninth aspect of the invention, the field programmable gate arrays are arranged and configured to operate with a word width between 1 to mXN bits where m is the number of bits in the word width of each memory and N is the number of memories.

In a tenth aspect of the invention, the first processing element and the second processing elements are configured in an asynchronous pipeline architecture.

In an eleventh aspect of the invention, at least one of the memories is a DDR SDRAM memory.

In twelfth aspect of the invention, at least one of the memories is a QDR SDRAM memory.

While the claimed apparatus and method herein has or will be described for the sake of grammatical fluidity with functional explanations, it is to be understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112, are to be accorded full statutory equivalents under 35 USC 112.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE INVENTION

Turning now to the figures wherein like numerals denote like elements among the several views, FIG. 1 illustrates one of the limitations of prior art FPGA-based processor systems. As earlier stated, FPGAs are generally designed based on one or more design rules that assume a fixed and limited word width which is particularly limiting when used in combination with requisite large amounts of memory in demanding applications such as data processing, deep packet inspection and analysis, cyber-security and networking.

FIG. 2 is a simplified schematic view of a memory-enhanced field programmable gate array as disclosed in U.S. Pat. No. 6,856,167 entitled "Field Programmable Gate Array with a Variably Wide Word Width Memory" issued Feb. 15, 2005 where all memory bits are simultaneously available to the FPGA such that the FPGA, incorporating suitable logic, can implement a virtual word width of any desired width from 1 to mXN bits. The memory-enhanced field programmable gate array there disclosed is also referred to as individual "processing elements 10" herein.

Figure 3:
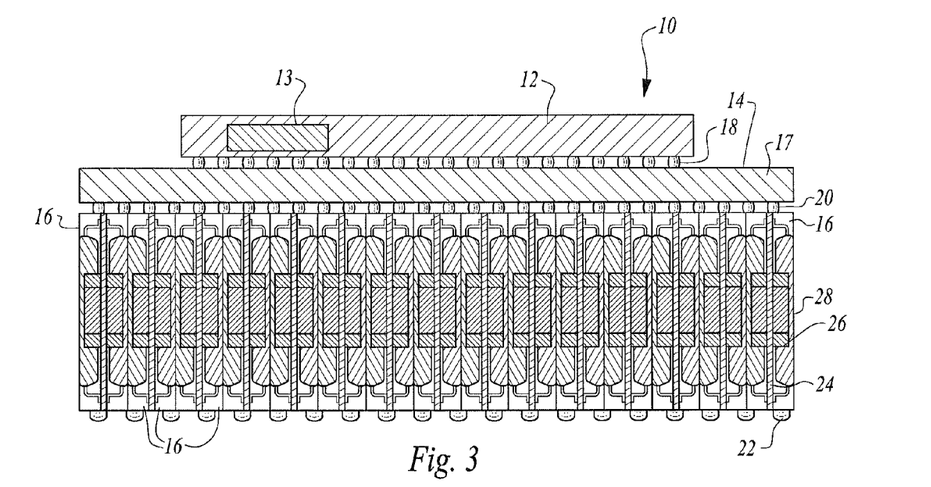
FIG. 3 depicts an FPGA coupled to an access lead network formed by a proximate interposer board and coupled to a plurality of memories as is disclosed in U.S. Pat. No. 6,856, 167 entitled "Field Programmable Gate Array with a Variably Wide Word Width Memory" issued Feb. 15, 2005.

FIG. 3 depicts a preferred embodiment of an individual processing element 10 of the invention where an FPGA is electrically coupled to an electrically conductive access lead network formed, in this particular case, by a proximate interposer or printed circuit board means and a first ball grid array such as disclosed in U.S. Pat. No. 6,856,167, entitled "Field Programmable Gate Array with a Variably Wide Word Width Memory" issued Feb. 15, 2005. It is noted that any embodiment of the combined memory array and field programmable gate array device disclosed therein are well-suited for use in the instant invention.

In the individual processing element 10 of FIG. 3, memory-enhanced gate array processing element 10 is illustrated in a diagrammatic assembled view and is preferably fabricated using a stacked architecture such as that developed by Irvine Sensors Corp., assignee herein, and generally described in various Irvine Sensors Corp. issued patents.

Such stacked architectures are characterized by desirable high port density, low parasitics and low power consumption. In the embodiment shown in FIG. 3, a field programmable gate array (FPGA) 12 is disposed on a first side of an interposer board 14 through a conventional solder ball grid array 18 connection there between. Any FPGA now available or later devised may be used in the illustrated architecture.

In this particular embodiment, the interposer board 14 that forms the access lead network is an insulating printed circuit board having a first surface (the upper side of element 14 in FIG. 3) with a electrical contact pattern arranged and configured to electrically connect to the ball grid array 18 of FPGA 12 and having a plurality of conductive vias 17 defined there through, connecting ball grid array 18 with a contact pattern arranged and configured to connect to the ball grid array 20 on a second surface (the bottom side of element 14 in FIG. 3).

Disposed adjacent the second side of the interposer 14 in an edgewise fashion are a plurality of memory integrated circuits 16. In the illustrated embodiment, memory integrated circuits 16 are organized in a "loaf fashion"; that is each circuit 16 may be viewed as a "slice of bread" stacked together to collectively form a "loaf" with a first side of the loaf in contact with interposer board 14. In the illustrated embodiment, the memory integrated circuits 16 are synchronous dynamic random access memories (SDRAMs/DDR SDRAMs) but may comprise any desired memory element such as QDR memory devices. Further, while the illustrated embodiment reflects the layers of individual processing element 10 oriented in a "loaf" or horizontal format, the invention is not limited to such a format and the layers can be oriented in a "stack of pancakes" or vertical format or a combination of both formats as disclosed in various applications issued to the assignee herein.

The leads of memory integrated circuits 16 are connected directly to ball grid array 20 in the case of leads exiting memory integrated circuits 16 on first ends of memory integrated circuits 16 near interposer board 14 and through interleaved lines 24 between memory integrated circuits 16 in the case of leads on the lower ends of memory integrated circuits 16 disposed away from interposer board 14.

The interleaved conductive lines 24 are connected to ball grid array 22 on a second surface (the bottom as shown) of memory-enhanced gate array processing element 10 which, in turn, are coupled to the leads of memory integrated circuits 16 disposed away from interposer board 14. Interleaved lines 24 are then led upward through an insulatively filled layer 26 and connected into ball grid array 20 next to the upper ends of integrated circuits 16 adjacent to interposer board 14. Also included in layer 26 of this embodiment is a conventional discrete or integrated circuit resistor and capacitor combination 28 coupled in a conventional manner with integrated circuits 16 to optimize memory speed.

An FPGA 12 used in connection with this invention may, in an alternative embodiment, be arranged and configured as disclosed in U.S. Pat. No. 7,082,591, issued Jul. 25, 2006 entitled "Method for Effectively Embedding Various Integrated Circuits within Field Programmable Gate Arrays". As therein disclosed, FPGA 12 is configured to operate with a parameterized word width which can be configured or "field programmed" as suggested by block 13, which provides "variable word width logic" means. Hence, in the illustrated embodiment, the memory block of memory enhanced gate array processor element 10 operates so that the memory is addressable in word widths of 1 to mXN bits.

It is a further advantage of the invention that FPGA 12 and more importantly, its leads are in very close proximity to the addressable leads of memories 16, thereby avoiding a host of timing and capacitance problems that can arise when the FPGA and the memory array are separated by substantially longer line lengths as occurs on a conventional flat or planar printed circuit board layout.

Beneficially, there are no bus-width related processor-to-memory bottleneck or memory bus contention issues with the architecture of individual processing element 10 and there is negligible response skew as compared with prior art devices having simultaneous connections to multiple memory chips arranged on a planar substrate.

In a conventional prior art bused and planar arrangement of memory, the maximum transfer rate is m bits multiplied by the clock speed. In a memory-enhanced gate array processing element 10, the maximum transfer rate becomes mXN bits times the clock rate. Skew is minimized because the equal lead length topology associated with the stacked embodiments of this invention making it unnecessary to account for different timing/response times to differently located memory circuits.

Further, processing element 10 may be characterized by "virtual" memory modularity and a hidden memory-to-pin configuration. The virtual memory modularity arises from the fact that the invention permits mXN bits of memory to be accessed in any desired word width from 1 bit to mXN bits.

By way of example and not by limitation, 16 one GB memory chips that are 18-bits wide could be addressed as any one of the following configurations, and more:
 1 GB memory with 18 times 16 word width;
 2 GB memory with 18 times 8 word width;
 4 GB memory with 18 times 4 word width;
 16 GB memory with 18 times 1 word width.

As disclosed in U.S. Pat. No. 7,082,591, issued Jul. 25, 2006 entitled "Method for Effectively Embedding Various Integrated Circuits within Field Programmable Gate Arrays", an FPGA-based processing element 10 may comprise a plurality of pre-formed IC chips encapsulated in stackable layers in an electronic package that comprises a field programmable gate array and one or more auxiliary logic components coupled to the FPGA with at least one intercommunicated clock, and control and/or data signals between the FPGA and the auxiliary logic component or components. The auxiliary components may have a functionality mapped into the FPGA. The FPGA may have a pin definition which, in one embodiment, is redefined so that the FPGA and the auxiliary logic component function in combination as a modified FPGA.

In one embodiment, a test circuit may be programmed into the FPGA to exercise the auxiliary logic component to test functionality and timing performance, preferably at full system speed. The functionality of the auxiliary logic component that is mapped into the FPGA may be parameterized, such as an arbitrary data word width for reading and/or writing data words of different or varying word lengths into the auxiliary component in both an aligned and a nonaligned manner.

A memory interface may be provided that allows multiple auxiliary logic circuits to be accessed through the FPGA together to variably generate a wider data word or serially to achieve a greater memory depth.

Utilizing Applicant's stacking processes to provide novel memory accessibility for the instant invention beneficially provides a very dense processing cache which, in turn, permits large numbers of data processing elements (e.g., an incoming stream of variably wide IPV4 or IPV6 packets with varying header and payload data) to be processed within a limited number of processing elements 10. This, in combination with the distribution of dense memory stacks within the architecture of the processing elements 10 in a pipeline architecture, permits massively parallel processing and the execution of multiple algorithms within a greatly reduced number of clock cycles.

In this configuration, the processor core of the invention is able to distribute local parallelism into a preexisting hierarchical architecture across, for instance, a series of server "blades" (PCB boards) within a single communication chassis; permitting the ability to "scale" the number of high-speed processing cores into a single distinct processing system that is optimized to meet a predefined high-speed processing requirement.

The key driver in high-speed network processing system design is generally the duration of a minimum-size packet at line rate (Tmin). (A commonly accepted minimum IP packet size is 64 bytes.) To perform an operation on a packet at line rates, any operation that takes longer than this duration must be parallelized either by breaking the operation down into smaller steps (e.g., pipelining), or by spreading the load over multiple processing elements (e.g., cluster parallelism).

Acceptable high-speed router designs generally employ pipelining rather than load splitting because pipelining rarely changes the behavior of the processing while load-splitting can introduce ordering and state-sharing complications. Load-splitting designs usually depend on flow bandwidth being small relative to a single processing element and on passing all packets of all flows that share a state through a single processing element. These characteristics do not necessarily hold for the target environment of system network monitor flows where a scan may be multiple gigabits in bandwidth and where many different detection algorithms must examine traffic across multiple flows.

As an illustrated example of a network processor operating at 1 Gb/s line rate, Tmin is very short, i.e., about 500 ns, depending on certain variables. A Tmin of 500 ns allows thousands of instructions per packet in a single conventional 3 GHz CPU core, but only permits about 10 random memory references to a main processor memory element. Moreover, six of these 10 memory accesses are used merely to read the packet into memory and into selected fields into the CPU registers. This leaves only four memory accesses per packet for algorithm data structures. Unfortunately, these structures usually do not fit onto CPU L1 or L2 caches and exhibit no locality of reference, so greatly increased access to main memory is needed. The timing and memory access problems are further exacerbated at higher lines.

Conventional processors are only marginally effective at processing packets even at a relatively low 1 Gb/s line rate, so load-splitting parallelism is generally required. Since this restricts algorithm choices, load-splitting requires additional bookkeeping relative to packet ordering and, moreover scales poorly to high line rates, i.e., 100 Gb/s (requiring hundreds of CPU's, each with its own main memory).

To address the above, Applicant discloses a multi-gigabit processor and router design using high-performance pipelined, memory-enhanced FPGA-based hardware which may include a 10 GigE transceiver (not shown) on the front end for direct traffic attachment to a network.

The use of FPGAs in place of ASICs permits algorithm flexibility and interchangeability over time and permits a memory-rich, FPGA-based pipeline architecture, permitting scalable daisy-chaining of processor cores (i.e., scalability) for additional processing power. Use of FPGAs also desirably eliminates the inflexibility, long design cycles, and high design costs of ASICs and enables short-turn software/firmware responses to evolving threats in a network. The FPGA firmware architecture of the invention relaxes timing constraints that frequently make hardware programming difficult, so that software developers can easily add new detection functions to the system.

The flow-through pipeline design of the invention, with dedicated bus-less memory elements for each function, ensures that individual functional blocks do not interfere with each other and all intended sensors receive all necessary data. Applicant has demonstrated 1 Gb/s and 10 Gb/s line-rate performance for a subset of detection algorithms that are scalable to accommodate future higher performance FPGA/s and interconnects. In the preferred embodiment, QDR memories are used to support a "one read/one write" per packet time of five ns, adding additional pipeline stages to add performance required by new algorithms.

Figure 4:
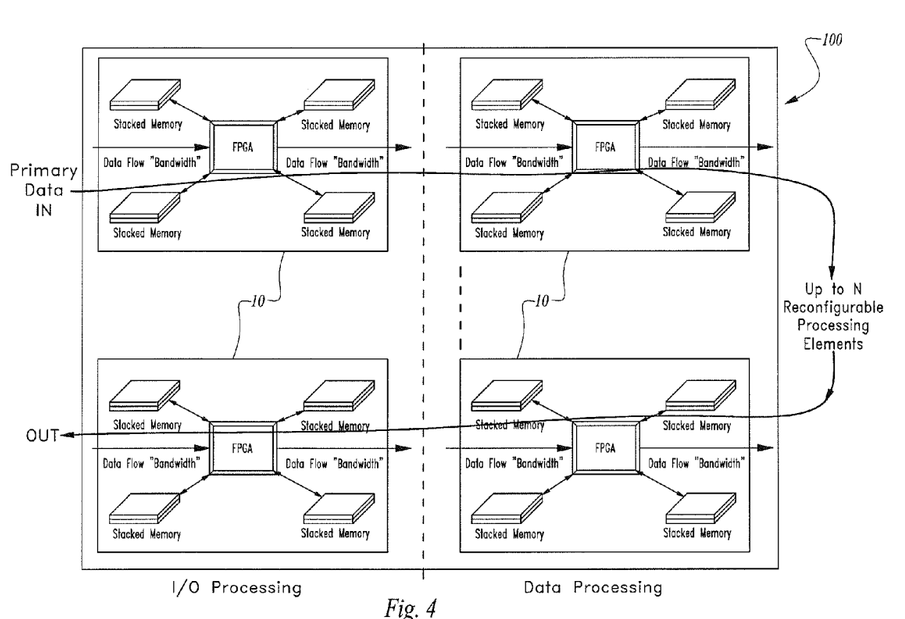
FIG. 4 shows a high level block diagram of multiple, high-speed processing elements in a preferred embodiment of the high-speed processing core of the invention comprising a plurality of memory-enhanced field programmable gate arrays configured in a pipeline architecture.
Figure 5:
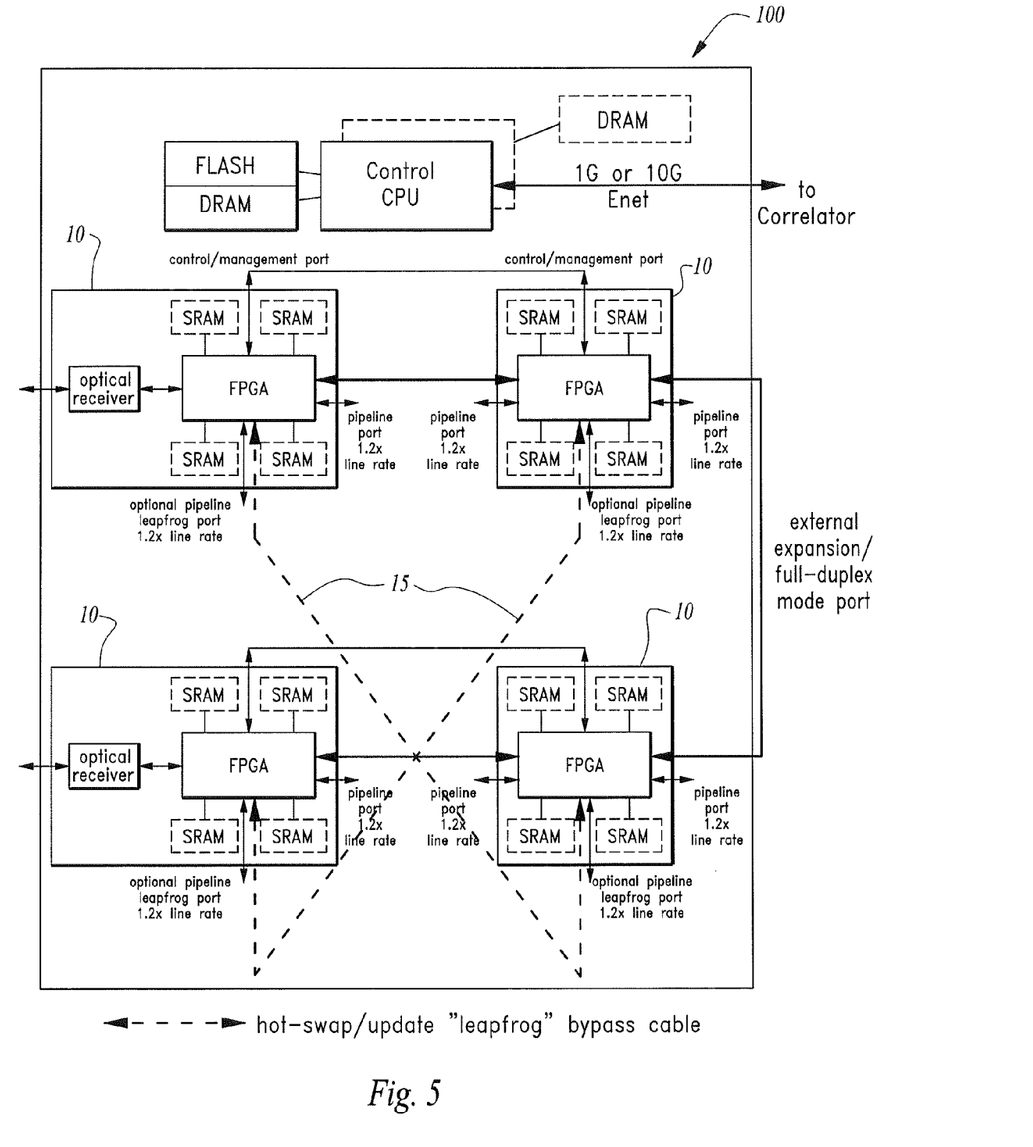
FIG. 5 illustrates a more detailed block diagram of multiple high-speed processing elements in a preferred embodiment of the high-speed processing core of the invention.
Figure 6:
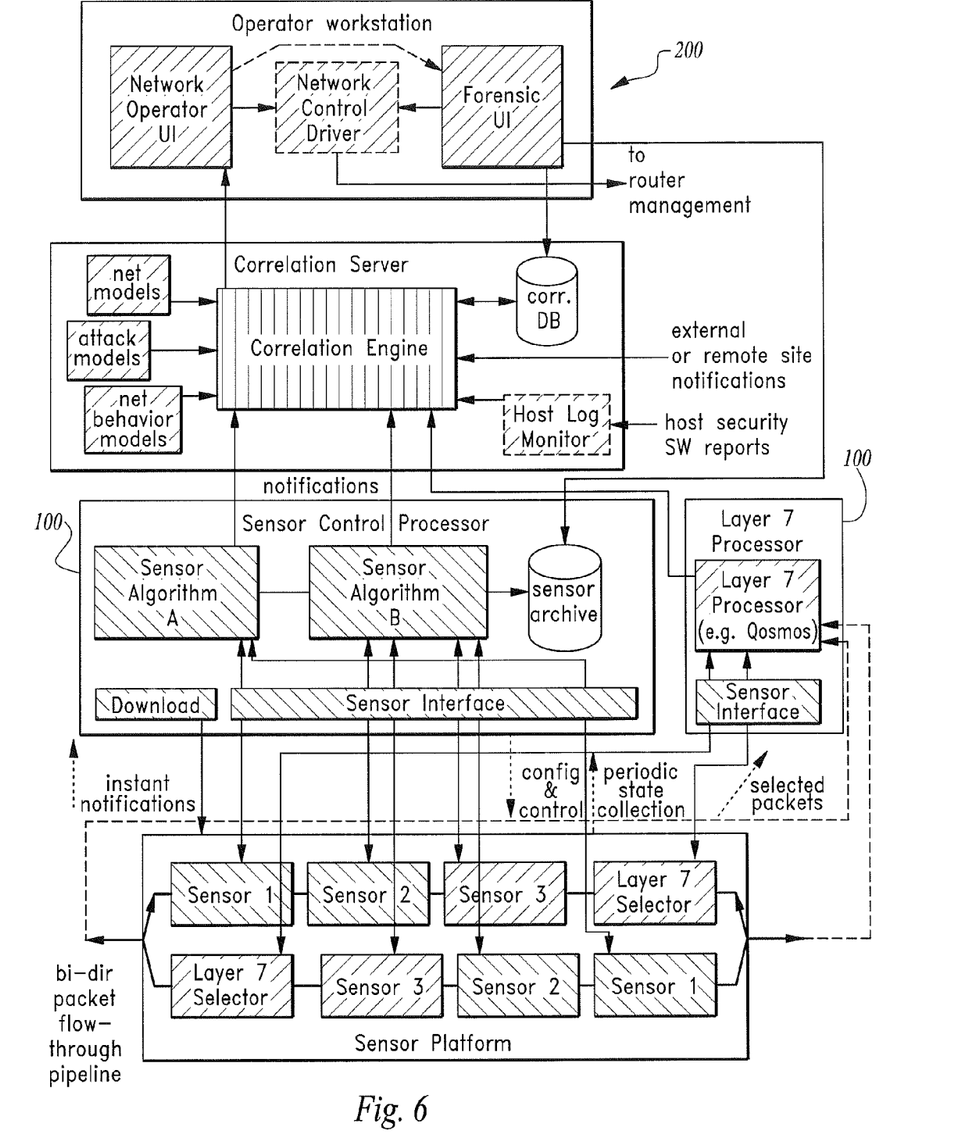
FIG. 6 depicts an embodiment of an intrusion detection system that comprises a processor core of the invention.

Therefore, a memory-parallel, extensible, FPGA-based packet-processing pipeline for network defense for use in a high-speed multiple-Gb/s processor and intrusion detection system is disclosed in FIGS. 4, 5 and 6.

As a further example of a processor operating at an increased line rate of 10 Gb/s, Tmin now becomes 50 ns and prior art FPGA devices are thus only allowed a single random memory access to memory (read, write, or read-modify-write) which is insufficient for line rate packet inspection.

To address this deficiency, a preferred embedment of the disclosed processor core may comprise FPGAs or FPGA stacks comprising five ns access SRAMs, which can support up to about 10 reads or writes per packet. Between the I/O card and the SRAM card of the system, there may be multiple SRAM memories available, each may be 16 MB in size, allowing 60 memory accesses per packet, each up to 64 bits wide. The FPGAs in a preferred embodiment may also each contain 384 2.5 ns 18 Kb memories, which are well-suited for small data structures, mapping tables, and state variables.

As yet a further example, when a network line rate is 100 Gb/s, Tmin is only 5 ns. At this rate, the SRAMs allow a single access (read or write) per packet, and many algorithms require both a read and a write per variable-two accesses per packet. In this higher speed embodiment, 400 MHz (2.5 ns access) QDR-II SRAMs may be incorporated into the processor, permitting two reads and two writes per packet.

Turning now specifically to FIG. 4, a block diagram view of multiple high-speed individual reconfigurable processing elements 10, each integrated into a single high-speed processor core 100 of the invention is depicted.

In the illustrated preferred embodiment, the processor core 100 is callable and supports N number of individual processing elements 10, allowing, for instance, 100 Gb/s of processing power per system while scalable to accommodate any number of processing elements 10.

One or more individual processing elements 10 may be configured to perform separate, dedicated processor core 100 system functions or predetermined operations; i.e., one or more processing elements dedicated to the administration and execution of one or more user-defined algorithms or functions relative to receiving input data or network packets, one or more processing elements 10 dedicated to one or more user-defined algorithms relative to, for instance, intrusion detection, deep packet inspection, virus or malicious code detection, etc, and a processing elements 10 dedicated to the administration and execution of one or more user-defined algorithms or functions relative to outputting the processed data from processor core 100.

In the illustrated embodiment, four processing elements 10 are shown as configured in a balanced, synchronous or asynchronous, scalable pipeline architecture whereby the output of the processing element 10 performing input processing is received as input data for algorithm execution and processing to the next-in-line processing element 10, which data and processing flow (i.e., outputting of a first reconfigurable processing element received as an input of a second reconfigurable processing element) is continued in pipeline fashion through processor core 100 up to the output processing element 10 dedicated to an output processing function.

To achieve the high line rate processing speeds need for network packet inspection and analysis, the preferred material used for the printed circuit boards of the invention is a thin film material having a predefined embedded capacitance (e.g., 40-mil or less Faradflex available from Oak-Mitsui Technologies). This form of printed circuit board material permits very dense, blind and buried, low-parasitic conductive vias to be fabricated in the areas that the processor and memory stacks reside. The use of this thin film printed circuit board material has been shown to support over one thousand interconnections within the board itself to provide very dense I/O and processor connections capable of operating at very high clock speeds.

Traditional circuit board materials using FR4 and ceramic materials are less desirable and do not readily achieve the desired interconnectivity to support the high-speed processing architecture described herein while the above cited circuit board material is well-suited for very high operating frequencies and a large number of interconnects needed for line rate data processing.

As better seen in the processor core 100 block diagram embodiment of FIG. 5, the individual processing elements 10 may be connected in a crossbar or matrix arrangement or configuration using a bidirectional leapfrog means 15 such as a bypass cable. The individual processing elements 10 are thus configured whereby the multiple outputs of the one or more of the individual processing elements 10 may be interconnected to one or more of the inputs of the other individual processing elements 10 to increase the interconnectivity of the individual processing element functions.

In one embodiment, the high-speed processor core 100 of the invention may be configured to function as a processor subsystem in the intrusion detection system 200 of FIG. 6. In the illustrated embodiment, system 200 is configured to examine a threat attack from a network behavior and traffic analysis perspective; triaging the threat for deep inspection as desired.

In the embodiment of FIG. 6, processor cores 100 are configured to function as a sensor control processor and as a Layer 7 processor of system 200 but may be used wherever low-latency, memory-intensive FPGA processing is needed or desired.

System 200 of the invention may be used for analyzing all layers from 2-7 of the Open Systems Interconnection (OSI) model or be used for network statistics, flow identification for traffic analysis and anomaly-based intrusion detection, selective intercept and off-load of packets to secondary analysis systems.

System 200 can be used to directly monitor network traffic and is able to log payload information from packets, such as authenticated user identifiers. This allows actions to be traced to specific user accounts. System 200 can further be configured to perform packet captures. Typically this is done once an alert has occurred, either to record subsequent activity in the connection or to record the entire connection if system 200 has been temporarily storing the previous packets.

Because of the dramatically enhanced ability to process electronic data, the ability to execute complex algorithms at network line rates and the ability to be readily reconfigured, the following types of attacks and detection events are well-suited for implementation in a system 200 comprising one or more processor cores 100:

1. Denial of service (DoS) attacks (including distributed denial of service [DDoS] attacks). These attacks typically involve significantly increased bandwidth usage or a much larger number of packets or connections to or from a particular host than usual. By monitoring these characteristics, high-speed anomaly detection methods can determine if the observed activity is significantly different than the expected activity.

2. Scanning. Scanning is detected by system 200 by typical flow patterns at the application layer (e.g., banner grabbing), transport layer (e.g., TCP and UDP port scanning), and network layer (e.g., ICMP scanning).

3. Worms. Worms spreading among hosts can be detected by system 200 in more than one way. Some worms propagate quickly and use large amounts of bandwidth. Worms can also be detected because they can cause hosts to communicate with each other that typically do not, and they can also cause hosts to use ports that they normally do not use.

4. Unexpected application services (e.g., tunneled protocols, backdoors, use of forbidden application protocols). These are detected through state-based protocol analysis methods, which can determine if the activity within a connection is consistent with the expected application protocol.

5. Policy violations. System 200 of the invention permits administrators to specify detailed policies, such as which hosts or groups of hosts a particular system may or may not contact, and what types of activity are permissible only during certain hours or days of the week.

6. Identifying Hosts. System 200 is able to create a list of hosts on the organization's network arranged by IP address or MAC address. The list can be used as a profile to identify new hosts on the network.

7. Identifying Operating Systems. System 200 is able to identify the OSs and OS versions used by the organization's hosts through various techniques. For example, the sensors track which ports are used on each host, which indicates a particular OS or OS family (e.g., Windows, Unix). System 200 is able to analyze packet headers for certain unusual characteristics or combinations of characteristics that are exhibited by particular OSs; known as passive fingerprinting. The sensors of system 200 identify application versions (as described below), which in some cases implies which OS is in use. Knowing which OS versions are in use is helpful in identifying potentially vulnerable hosts.

8. Identifying Applications. System 200 can identify the application versions in use by keeping track of which ports are used and monitoring certain characteristics of application communications. For example, when a client establishes a connection with a server, the server might tell the client what application server software version it is running, and vice versa. Information on application versions are used to identify potentially vulnerable applications, as well as unauthorized use of some applications.

9. Identifying Network Characteristics. System 200 has the ability to collect general information about network traffic related to the configuration of network devices and hosts, such as the number of hops between two devices. This information is used to detect changes to the network configuration.

10. Observed Events. System 200 is able to reconstruct a series of observed events to determine the origin of a threat. For example, if worms infect a network, system 200 sensors can analyze the worm's flows and find the host on the organization's network that first transmitted the worm to other hosts.

11. Application layer reconnaissance and attacks (e.g., banner grabbing, buffer overflows, format string attacks, password guessing, malware transmission). System 200 can analyze several dozen application protocols. Commonly analyzed ones include Dynamic Host Configuration Protocol (DHCP), DNS, Finger, FTP, HTTP, Internet Message Access Protocol (IMAP), Internet Relay Chat (IRC), Network File System (NFS), Post Office Protocol (POP), rlogin/rsh, Remote Procedure Call (RPC), Session Initiation Protocol (SIP), Server Message Block (SMB), SMTP, SNMP, Telnet, and Trivial File Transfer Protocol (TFTP), as well as database protocols, instant messaging applications, and peer-to-peer file sharing software.

12. Transport layer reconnaissance and attacks (e.g., port scanning, unusual packet fragmentation, SYN floods). The most frequently analyzed transport layer protocols are TCP and UDP.

13. Network layer reconnaissance and attacks (e.g., spoofed IP addresses, illegal IP header values). The most frequently analyzed network layer protocols are IPv4, ICMP, and IGMP. System 200 can do full analysis of the IPv6 protocol, such as confirming the validity of IPv6 options, to identify anomalous use of the protocol.

14. Unexpected application services (e.g., tunneled protocols, backdoors, hosts running unauthorized application services). These are usually detected through state-based protocol analysis methods, which can determine if the activity in a connection is consistent with the expected application protocol, or through anomaly detection methods, which can identify changes in network flows and open ports on hosts.

15. Policy violations (e.g., use of inappropriate Web sites, use of forbidden application protocols). Some types of security policy violations can be detected by system 200 that allow administrators to specify the characteristics of activity that should not be permitted, such as TCP or UDP port numbers, IP addresses, Web site names, and other pieces of data that can be identified by examining network traffic.

16. Encrypted Traffic—System 200 can monitor the initial negotiation conducted when establishing encrypted communications to identify client or server software that has known vulnerabilities or is misconfigured. This can include application layer protocols such as secure shell (SSH) and Secure Sockets Layer (SSL), and network layer virtual private networking protocols such as IP Security (IPsec).

17. Attack Success—System 200 sensors can determine if an attack is likely to succeed. For example, sensors might know which Web server software versions are running on each of the organization's Web servers. If an attacker launches an attack against a Web server that is not vulnerable to the attack, then the sensor might produce a low-priority alert; if the server is thought to be vulnerable, then the sensor might produce a high-priority alert. System 200 is configured to stop attacks whether or not they are likely to succeed, but the system 200 might still log the activity with different priority levels depending on what its outcome probably would have been if not blocked Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

I claim:

1. An electronic processor core comprising:
   a first reconfigurable processing element configured to execute a first predetermined algorithm on input data and to output processed data from the first predetermined algorithm having a variably wide word width as an output data set,
   a second reconfigurable processing element configured to execute a second predetermined algorithm,
   the first processing element and the second processing element configured so that the variably wide word width output data set of the first processing element is received as a variably wide word width input data set of the second processing element,
   the first and second processing elements each comprising a processor, an access lead network electrically coupled and proximate to the processor and a plurality of external memories electrically coupled and proximate to the access lead network, and,
   wherein the processor can independently access each of the plurality of external memories via the access lead network without use of an address/data bus.

2. An electronic processor core comprising:
   a first reconfigurable processing element configured to execute a first predetermined algorithm on input data and to output processed data from the first predetermined algorithm having a variably wide word width as an output data set,
   a second reconfigurable processing element configured to execute a second predetermined algorithm,
   the first processing element and the second processing element configured so that the variably wide word width output data set of the first processing element is received as a variably wide word width input data set of the second processing element,
   the first and second processing elements each comprising a field programmable gate array, an access lead network electrically coupled and proximate to the field programmable gate array and a plurality of external memories electrically coupled and proximate to the access lead network, and,
   wherein the field programmable gate array can independently access each of the plurality of external memories via the access lead network without use of an address/data bus.

3. The device of claim 2 wherein the field programmable gate arrays are arranged and configured to operate with a variable word width.

4. The device of claim 2 where the field programmable gate arrays are arranged and configured to operate with a word width between 1 to mXN bits where m is the number of bits in the word width of each memory and N is the number of memories.

5. The device of claim 2 wherein the first processing element and the second processing element are configured in an asynchronous pipeline architecture.

6. The device of claim 2 where at least one of the memories is a DDR SDRAM memory.

7. The device of claim 2 wherein at least one of the memories is a QDR SDRAM memory.

8. The device of claim 2 wherein the inputs and outputs of a plurality of the processing elements are configured in a matrix arrangement.

9. A method for processing a data set comprising:
   providing a first reconfigurable processing element configured to execute a first predetermined algorithm and a second reconfigurable processing element configured to execute a second predetermined operation algorithm,
   the first processing element and the second processing element configured in an asynchronous pipeline architecture whereby an output data set of an algorithm executed by the first processing element is received as the input data set of the second processing element,
   the first and second processing elements comprising a field programmable gate array, an access lead network electrically coupled and proximate to the field programmable gate array and a plurality of external memories electrically coupled and proximate to the access lead network,
   wherein the field programmable gate array can independently access each of the plurality of external memories via the access lead network without use of an address/data bus,
   performing a first predetermined operation on a primary data set using the first processing element to generate an output data set,
   inputting the output data to the second processing element, and
   performing a second predetermined operation on the output data set using the second processing element.

10. The method of claim 9 wherein the field programmable gate arrays are arranged and configured to operate with a variable word width.

11. The method of claim 9 where the field programmable gate arrays are arranged and configured to operate with a word width between 1 to mXN bits where m is the number of bits in the word width of each memory and N is the number of memories.

12. The method of claim 9 wherein the first processing element and the second processing element are configured in an asynchronous pipeline architecture.

13. The device of claim 9 where at least one of the memories is a DDR SDRAM memory.

14. The device of claim 9 wherein at least one of the memories is a QDR SDRAM memory.

* * * * *